United States Patent
Burkholder

(10) Patent No.: US 9,667,022 B1
(45) Date of Patent: May 30, 2017

(54) DISTRIBUTED LASER POWER ARCHITECTURE FOR LASER DIODE ARRAYS

(71) Applicant: nLight Photonics Corporation, Vancouver, WA (US)

(72) Inventor: Gary L. Burkholder, Camas, WA (US)

(73) Assignee: nLIGHT, Inc., Vancouver, WA (US)

( * ) Notice: Subject to any disclaimer, the term of this patent is extended or adjusted under 35 U.S.C. 154(b) by 0 days.

(21) Appl. No.: 14/815,403

(22) Filed: Jul. 31, 2015

Related U.S. Application Data

(60) Provisional application No. 62/032,424, filed on Aug. 1, 2014.

(51) Int. Cl.
| | |
|---|---|
| H01S 3/067 | (2006.01) |
| H01S 5/068 | (2006.01) |
| H01S 5/06 | (2006.01) |
| H01S 5/40 | (2006.01) |
| H01S 5/022 | (2006.01) |
| H01S 3/0941 | (2006.01) |
| B01J 19/12 | (2006.01) |

(52) U.S. Cl.
CPC ............. *H01S 3/067* (2013.01); *B01J 19/121* (2013.01); *H01S 3/0941* (2013.01); *H01S 5/02248* (2013.01); *H01S 5/06* (2013.01); *H01S 5/06808* (2013.01); *H01S 5/4025* (2013.01)

(58) Field of Classification Search
CPC .... H01S 3/067; H01S 5/02248; H01S 5/4025; H01S 3/0941; H01S 5/06808
See application file for complete search history.

(56) References Cited

U.S. PATENT DOCUMENTS

| 2004/0119003 A1* | 6/2004 | Ikeda | B41J 2/473 250/234 |
|---|---|---|---|
| 2005/0201429 A1* | 9/2005 | Rice | B23K 26/0604 372/27 |

OTHER PUBLICATIONS

Linear Technology, News Release: "Convert Any Input Voltage from 2.8V to 80V into a Fixed Output Voltage or Output Current with Up to 98% Efficiency at 250W," and related data sheet "80V $V_{in}$ and $V_{out}$ Synchronous 4-Switch Buck-Boost DC/DC Controller," 46 pages (Feb. 11, 2013).

\* cited by examiner

*Primary Examiner* — Dung Nguyen
(74) *Attorney, Agent, or Firm* — Klarquist Sparkman, LLP

(57) ABSTRACT

Laser diode drivers include switching power supplies situated proximate one or more laser diode arrays so as to provide laser diode drive currents at frequencies of 200 kHz or more. The switching power supplies are generally buck/boost supplies that can provide well regulated outputs even when regulating remote power received from a power supply via a cables having inductances in the hundreds of nH. Multiple laser diode arrays can be driven with independently selectable powers. A drive current for a particular laser array can be controlled so as to reduce voltage drop at voltage control elements such as FETs, leading to increased efficiency, increased product life and decreased sense element failure.

16 Claims, 11 Drawing Sheets

DISTRIBUTED LASER POWER ARCHITECTURE FOR LASER DIODE ARRAYS

CROSS REFERENCE TO RELATED APPLICATION

This application claims the benefit of U.S. Provisional Application No. 62/032,424, filed Aug. 1, 2014, which is incorporated herein by reference in its entirety.

FIELD

The disclosure pertains to diode laser power systems.

BACKGROUND

Laser diode based systems can provide reliable optical radiation for a variety of materials processing applications. In contrast to other laser technologies, laser diodes are compact, relatively inexpensive, and do not require high voltages or other difficult electrical pump systems. In addition, the output power provided can be scaled by adding additional laser diodes, so that a desired power level can be relatively easily selected. Conventional high power laser diode systems use a remote power supply that is coupled to the laser diodes via a long cable. While the remote power supply can be large and difficult to move, it can be positioned as needed using sufficiently long electrical cables. Thus, a laser diode based optical head can remain compact and portable, even if a large or cumbersome power supply is needed.

Unfortunately, conventional designs as described above exhibit some significant drawbacks. In many applications, pulsed laser diode outputs are required and long cables connecting a power supply to the laser diodes make modulation of laser diode output difficult or impossible. Referring to FIG. 1, in a conventional laser diode system 100, a remote power supply 102 is coupled via a cable 104 to a laser diode module 106. As shown in FIG. 1, the cable has associated inductances 108, 109 that prevent the power supply 102 from providing rapid drive current modulations to the laser diode module 106. Laser diode modulations at rates greater than as low as about 10 kHz or with rise/fall times of about 50 µs can be difficult or impossible. In addition, precise control of laser diode operating currents can be difficult to establish. This lack of precise control can cause excess voltages/currents to be applied to laser diodes so that laser diodes and any associated control circuitry can be exposed to excess drive levels, leading to component failure. In high throughput materials processing applications, such failures can seriously reduce manufacturing rates and increase manufacturing costs.

SUMMARY

Laser diode systems comprise at least a first laser diode driver and a second laser diode driver, each of the first and second laser diode drivers comprising respective switch mode power supplies. At least a first laser diode array and a second laser diode array are coupled to the switch mode power supply of the first laser diode driver and the switch mode power supply of the second laser diode driver, respectively. A power input is situated to receive electrical power from a remote power supply and couple electrical power to the switch mode power supply of the first laser diode driver and the switch mode power supply of the second laser diode driver. In some embodiments a communication bus couples the first and second laser diode drivers and a controller is coupled to the communication bus so as to communicate one of a power level and a pulse repetition rate to at least one of the first and second laser diode drivers. In further examples, a first laser diode array drive current and a second laser diode array drive current are different. In some representative examples, the switch mode power supplies are buck/boost switch mode power supplies and each of the first and second laser diode drivers includes a set point adjustment that defines an input voltage range associated with a voltage range of the remote power supply.

Laser diode drivers comprise a switching power supply and a sense resistor coupled to the switching power supply and to a first laser diode driver output. A voltage controller is coupled to a second laser diode driver output, wherein the first and second laser diode driver outputs are coupled to provide a laser diode drive current such that the sense resistor is in series with the laser diode drive current. In some examples, the first and second laser diode outputs correspond to a laser diode array cathode and a laser diode array anode, respectively. In other embodiments, the switching supply includes a setpoint input associated with a voltage range to be input to the switching power supply. In still other examples, the voltage control circuit is situated to be in series with the laser diode drive current so as to establish a laser diode array cathode voltage based on a selected laser diode array drive current. In some alternatives, the switching power supply is coupled to a laser diode drive control that establishes at least one of a laser diode pulse rate, pulse duration, and pulse power. In one specific example, the pulse rate is at least 100 kHz. In still further embodiments, a slew rate control is coupled to at least one of the first and second laser diode driver outputs so as to limit a laser diode drive current slew rate. The slew rate control can include at least one capacitor situated in parallel with respect to the first and second laser diode driver outputs.

Materials processing systems comprise a remote power supply and a plurality of laser diode drivers coupled to the remote power supply, each of the laser diode drivers including a switching power supply. At least one laser diode array is coupled to each of the laser diode drivers so as to receive a drive current from the respective switching power supply. A controller is coupled to each of the laser diode drivers so as to select at least one of a drive current magnitude, a drive current duration, and a drive current frequency to be provided by the respective switching power supply, wherein at least one of the drive current magnitudes, drive current durations, and drive current frequencies is independently selectable. In a representative example, an optical system receives laser outputs from the laser diode arrays, forms a processing beam, and directs the processing beam to a substrate. In other embodiments, a scanning system is situated to move the substrate and the processing beam with respect to each other. Typically, the drive current frequencies for each of the laser diode drivers are a common frequency that is at least 50 kHz. In some alternatives, at least one of the plurality of laser diode drivers is coupled to a plurality of laser diode arrays so as to establish a common drive current in each laser of the plurality of laser diode arrays. In some examples, the laser diode outputs are used to pump a doped optical fiber such as in a fiber amplifier or fiber laser.

The foregoing and other objects, features, and advantages of the disclosed technology will become more apparent from the following detailed description, which proceeds with reference to the accompanying figures.

DETAILED DESCRIPTION

Figure 1:
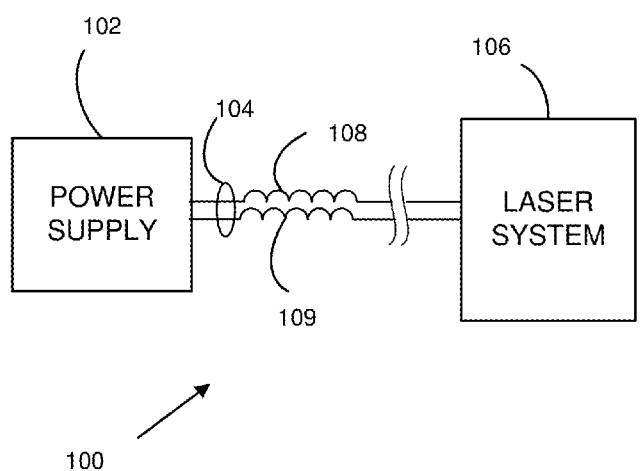
FIG. 1 is a schematic diagram of a conventional laser diode system.

As used in this application and in the claims, the singular forms "a," "an," and "the" include the plural forms unless the context clearly dictates otherwise. Additionally, the term "includes" means "comprises." Further, the term "coupled" does not exclude the presence of intermediate elements between the coupled items.

The systems, apparatus, and methods described herein should not be construed as limiting in any way. Instead, the present disclosure is directed toward all novel and non-obvious features and aspects of the various disclosed embodiments, alone and in various combinations and sub-combinations with one another. The disclosed systems, methods, and apparatus are not limited to any specific aspect or feature or combinations thereof, nor do the disclosed systems, methods, and apparatus require that any one or more specific advantages be present or problems be solved. Any theories of operation are to facilitate explanation, but the disclosed systems, methods, and apparatus are not limited to such theories of operation.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed systems, methods, and apparatus can be used in conjunction with other systems, methods, and apparatus. Additionally, the description sometimes uses terms like "produce" and "provide" to describe the disclosed methods. These terms are high-level abstractions of the actual operations that are performed. The actual operations that correspond to these terms will vary depending on the particular implementation and are readily discernible by one of ordinary skill in the art.

In some examples, values, procedures, or apparatus' are referred to as "lowest", "best", "minimum," or the like. It will be appreciated that such descriptions are intended to indicate that a selection among many used functional alternatives can be made, and such selections need not be better, smaller, or otherwise preferable to other selections.

Examples are described with reference to directions indicated as "above," "below," "upper," "lower," and the like. These terms are used for convenient description, but do not imply any particular spatial orientation.

In some disclosed examples, laser diodes, laser diode arrays, and laser diode drivers receive or provide drive currents that can vary in magnitude, duration, and frequency so that laser diode operation can be controlled. Such variations of laser drive parameters can be specified and distributed using one or more microcontrollers or other integrated circuits that provide digital control signals produced in response to predetermined values or established by a user. In other examples, laser drive values are established using analog circuit components such as voltage dividers or other networks. For convenience, both analog and digital devices that accomplish control of laser diode currents are referred to herein as controllers or control circuits. In typical examples described below, such laser diode currents are produced using one or more switching power supplies that are controlled based on specified drive values.

Figure 2:
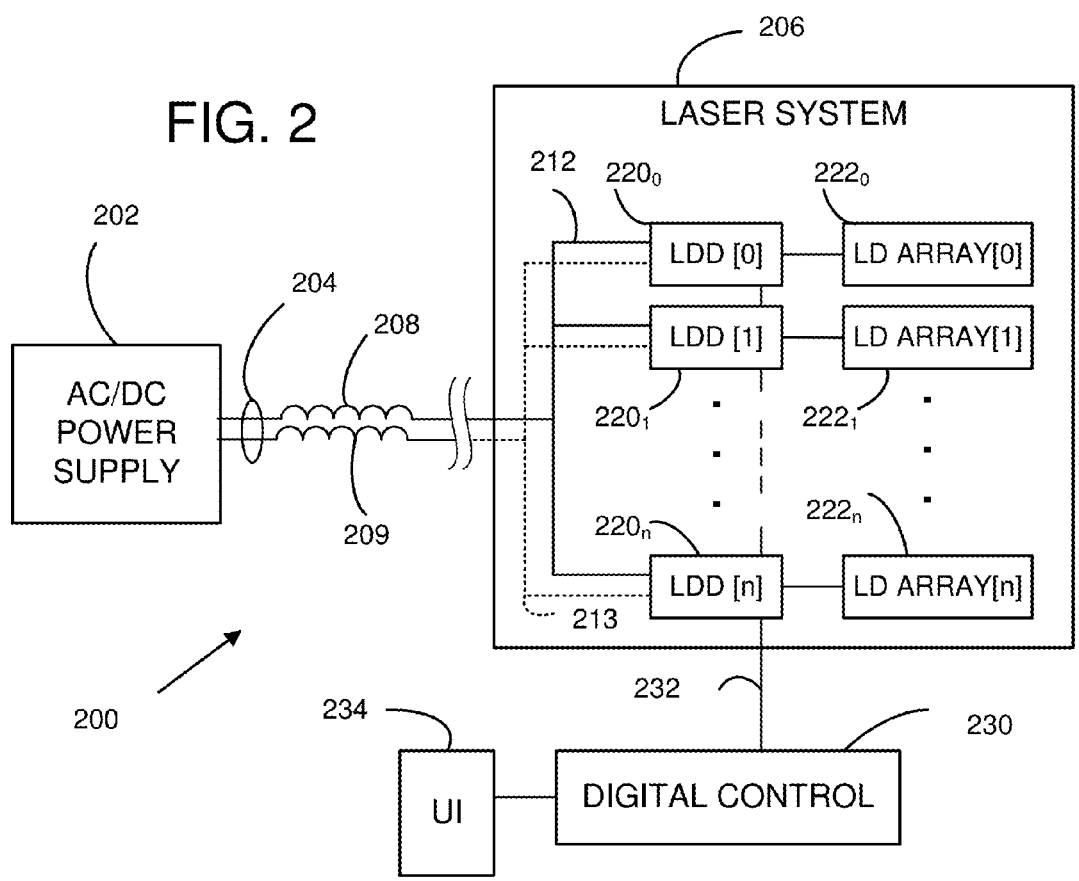
FIG. 2 is a schematic diagram of a representative laser diode system according to an example embodiment.

Referring to FIG. 2, a laser diode system 200 includes an AC/DC power supply 202 that is coupled by a cable 204 to a laser system 206. The cable 204 is associated with inductances 208, 209 and couples to laser diode drivers (LDDs) $220_0$-$220_n$ via cables 212, 213. The LDDs $220_0$-$220_n$ are coupled to respective laser diode (LD) arrays $222_0$-$222_n$ and the cables 212, 213 are arranged so that laser drive currents are independently provided to each of the LD arrays $222_0$-$222_n$. The LDDs $220_0$-$220_n$ are coupled to a digital controller via a control bus so that suitable drive currents, pulse durations, pulse frequencies, and other characteristics of power supplied to the LD arrays $222_0$-$222_n$ can be selected as preferred for each.

In some examples, the digital controller includes a memory device that stores predetermined operational parameters for some or all LD arrays, or one or more circuits provides a control current or voltage to establish operational parameters. For example, pulse repletion rate and/or pulse duration can be selected. In some applications, one or more user interface devices 234 is coupled to the digital controller 230 so that a user can configure operation as desired.

As shown in FIG. 2, power for operation of the laser system is provided by the AC/DC power supply 202, but the LDDs $220_0$-$220_n$ are arranged to adjust, regulate, convert, or otherwise condition this power for LD array operation. Typically, the LDDs $220_0$-$220_n$ can accommodate varying input voltages and/or currents from the AC/DC power supply 202 while maintaining controlled output of some (typically all) LD arrays.

Figure 3:
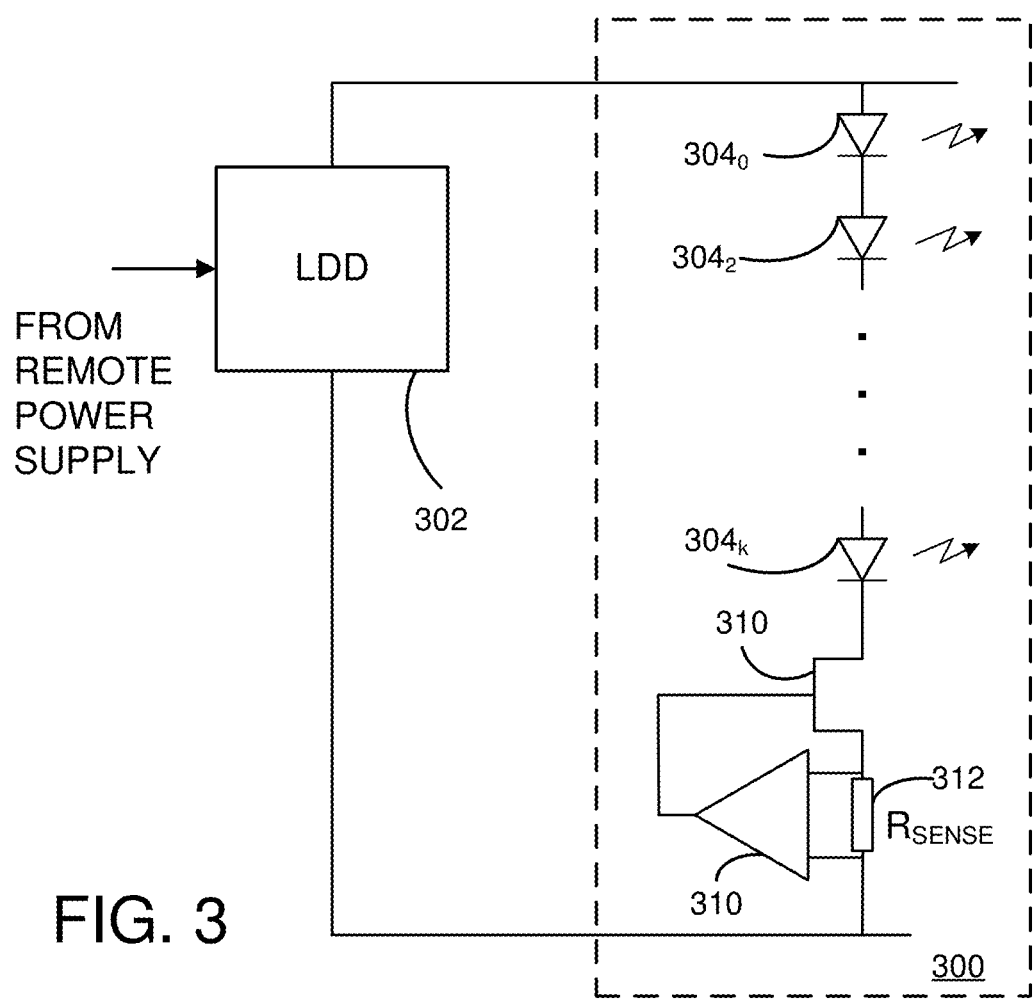
FIG. 3 is a schematic diagram of a laser diode driver coupled to a laser diode array that includes a sense resistor and other sense electronics.

FIG. 3 illustrates a representative laser diode array 300 that is coupled to a LDD 302 that is in turn coupled to a remote power supply. The laser diode array 300 includes laser diodes $304_0$-$304_k$, wherein k is an arbitrary positive integer. The laser diodes $304_0$-$304_k$ are connected in series and are thus power by a common current. The LDD 302 provides a predetermined current to the LD array 300 to establish an intended optical output power. The LD array also includes a FET 310 and a series sense resistor 312. An amplifier 314 is coupled to a gate of the FET 310 so that the FET (and the LD series current) is adjusted based on current in the sense resistor 312. Laser diode arrays as used in the system of FIG. 2 can include different numbers and types of laser diodes as may be convenient. While the LDD 302 generally provides a drive voltage so as to control LD drive current, the FET 310, the sense resistor 312, and the amplifier 314 so as to maintain drive current at a selected value.

In operation, a series current for each of the laser diodes $304_0$-$304_k$ is set to a common value, and an associated voltage drop across the laser diodes $304_0$-$304_k$ is also fixed. Any excess voltage produced by the LDD 302 necessarily appears across the FET 310. This excess voltage can increase power dissipation by the FET. Due to the potentially large series currents, this excess voltage is generally well controlled by the LD 302. In contrast, in conventional systems, the voltage applied to a laser diode array is not so well controlled, and excess power at the FET 310 can lead to device failure.

Figure 4:
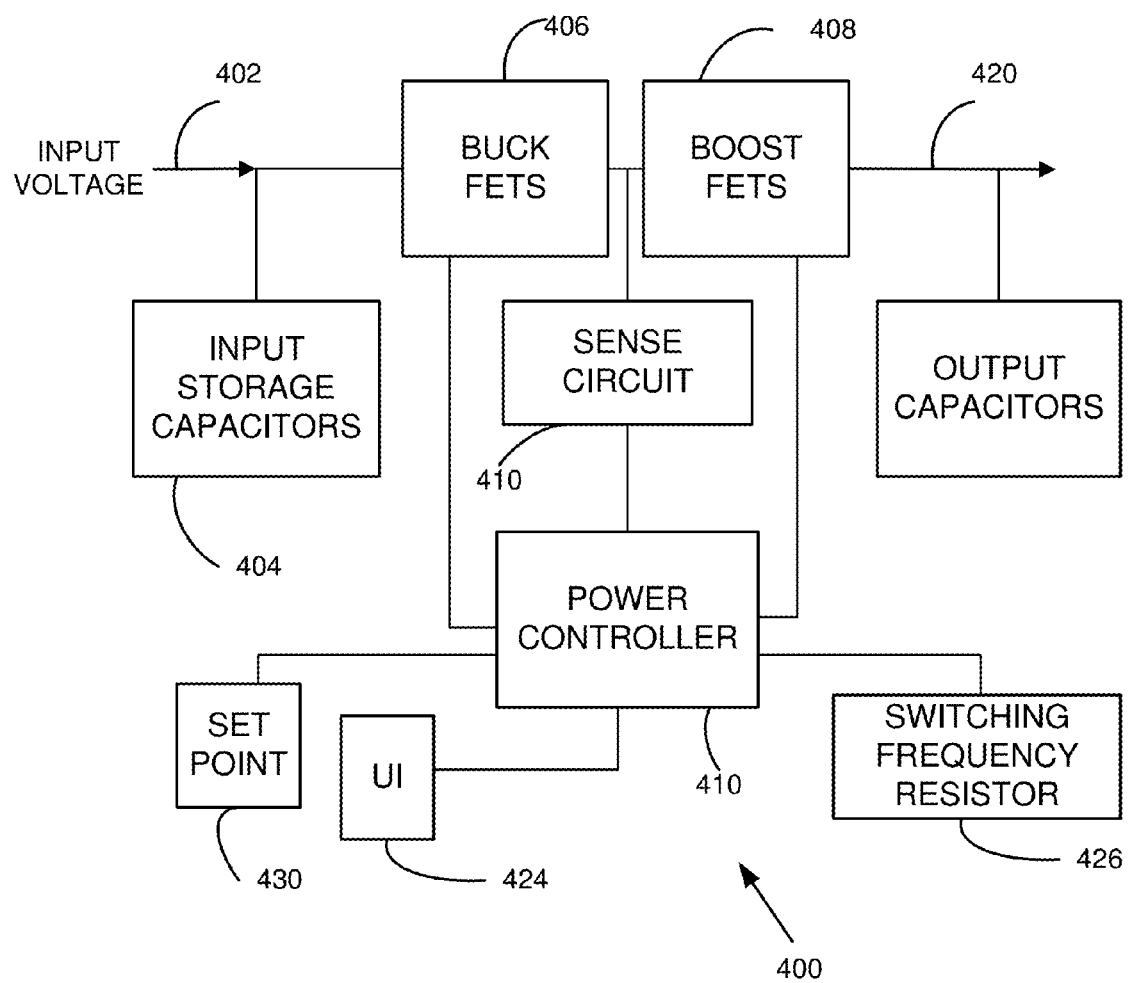
FIG. 4 is a schematic diagram of a representative buck/boost switching power supply suitable for receiving power from a remote power supply and supplying drive currents to one or more local laser diode arrays.

Referring to FIG. 4, a representative laser diode driver 400 includes an input 402 that receives power from a remote power supply such as illustrated in FIG. 2. One or more input storage capacitors 404 is coupled top the input 402 so as to provide at least some charge (energy) storage. The input 402 is further coupled to one or more buck FETs 406 and boost FETs 408, and sense circuit 410 couples a sense signal to a power controller 412. Typically the sense signal permits the controller to respond appropriately to step loads so as to not produce device failures. In one example, the power controller 412 is an LT8705 Synchronous 4-Switch Buck-Boost DC/DC Controller, available from Linear Technologies, Milpitas Calif., but other power control chips or circuits can be used. The regulated laser diode drive output voltage (and/or current) is coupled to an output 420 for use in driving a laser diode array. One or more output capacitors 422 are coupled to the output 420.

The output of the laser diode driver 400 can be controlled via a user interface 424 that provides one or more analog or digital voltage levels that are selected so as to adjust a switching frequency of the output. Alternatively, a resistor 426 can be provided to establish a fixed switching frequency. A voltage divider or other circuit components can serve as a set point control 430 so as to establish a voltage range over which the laser diode driver operates. By adjustment of the set point, laser diode arrays having different numbers of laser diodes and/or different types of laser diodes can be used with a common laser diode driver configuration.

Figure 5:
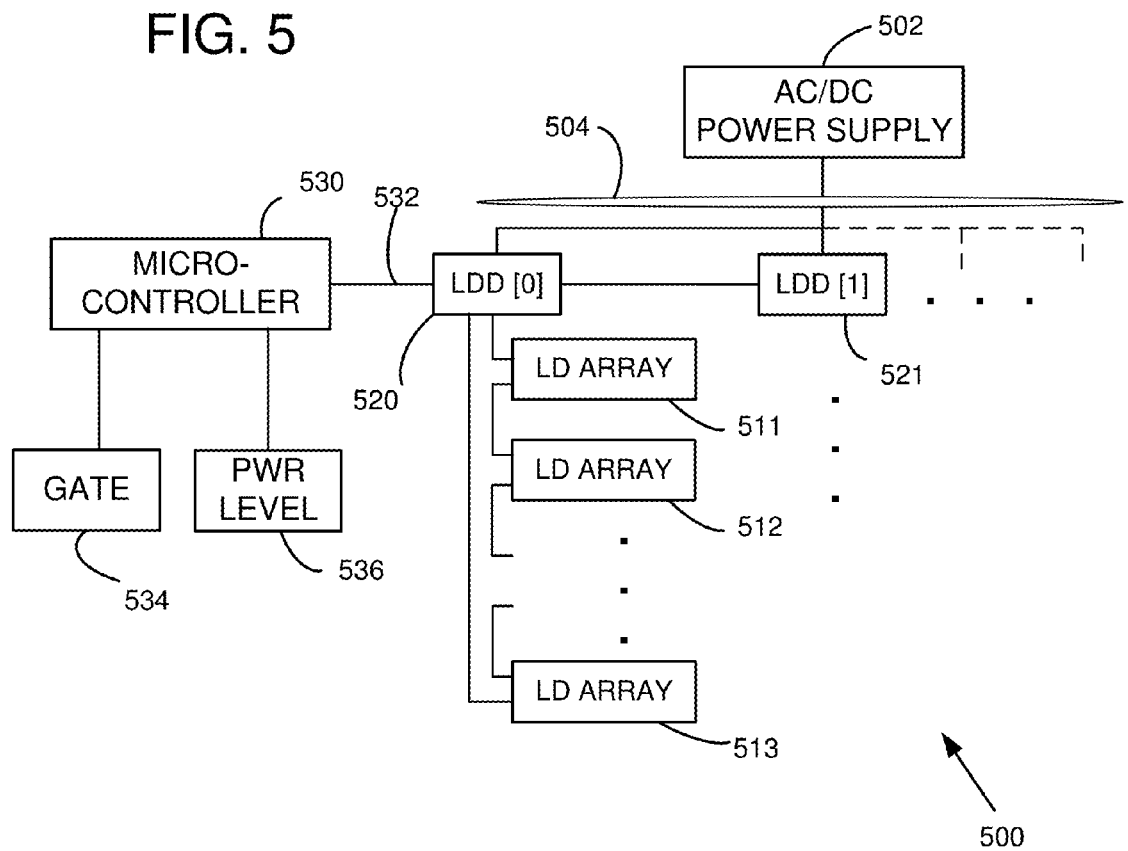
FIG. 5 illustrates a laser diode system in which multiple laser diode arrays provide a common drive current from a single switching power supply.

Another example of a laser system 500 is shown in FIG. 5. A power supply 502 is coupled via one or more electrical connections 504 to a plurality of LDDs, such as representative LDDs 520, 521. Each of the LDDs can be coupled to one or more LD arrays. For example, as shown in FIG. 5, the LDD 520 is coupled to LD arrays 511, 512, 513, but more or fewer LD arrays can be used. The LD arrays 511, 512, 513 can have the same or different numbers of laser diodes. For example, the LD arrays 511, 512 can have 12 and 6 laser diodes, respectively. The LD arrays 511, 512, 513 are coupled so that a series current provided by the LDD 520 is coupled through each LD array. As noted above, the LDD 520 is a buck/boost type switch mode power supply that conditions power from the AC/DC power supply 502.

Power levels, pulse rates, pulse durations, and other LD drive conditions are communicated from a microcontroller 530 to the LDDs 520, 521 via a daisy chained bus 532. As shown in FIG. 5, the microcontroller 530 receives a gating signal from a gating device 534 (such as a signal generator or other device) and a power level read from a computer readable storage device 536 or that is provided in some other fashion. While typically, each of the LD arrays has a common pulse duration, repetition rate, and pulse initiation and termination times, values for each of these and other parameters can be communicated by the bus 532.

Figure 6:
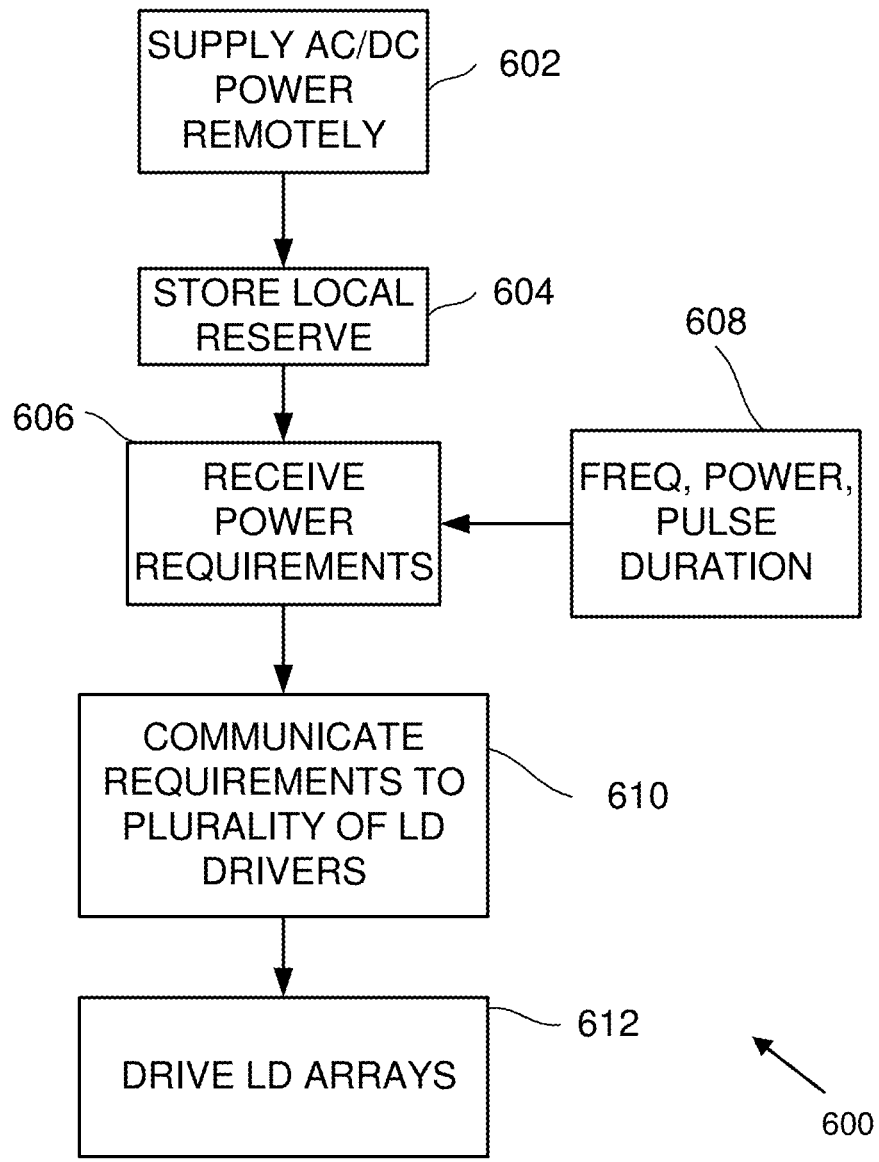
FIG. 6 is a block diagram of a method for providing drive currents to laser diode arrays.

A representative method 600 is illustrated in FIG. 6. At 602, electrical power is provided to a laser diode system from a power supply that can be situated remotely from the laser diode system. In typical examples, this electrical power provides currents and/or voltages with a predetermined range, but not precisely controlled so as to be suitable for directly driving a laser diode array. In many cases, DC electrical power is supplied, and any pulse drive power requirements for laser diodes are satisfied by other components. In some cases, this electrical power is associated with voltage ranges of between 10-100 V, 20-90 V, 30-80 V, or 35-75 V. As will be appreciated, because laser diodes operate at voltages of between about 1 V and 3 V, depending on diode construction and material bandgap, this voltage variation is generally unacceptable, and substantial voltage/power control must be provided.

At 604, some local reserve power is stored such as by charging one or more capacitors. This local storage tends to avoid power starvation at remote electronics that might otherwise occur during periods of high power demand. As noted previously, remote power must be supplied through a relatively high inductance associated with power cables, so that temporal response to power demands can be limited. At 606, laser diode array power requirements are established, and can be communicated from a remote controller, or be established by dedicated circuit components such as voltage dividers or other circuit configurations. As shown at 608, typical laser diode array power requirements are associated with repetition rate (pulse frequency), pulse duration, and pulse power. At 610, power requirements are directed to local laser diode drivers that are coupled to one or more laser diode arrays. In some examples, a daisy chain bus is used to communicate these requirements, and in many cases, the laser diode drivers receive common laser drive parameters such as pulse repetition rate and pulse duration. In other examples, each laser diode driver can be operated based on different laser drive parameters.

At 612, remote power is processed by one or more laser diode drivers so as to operate one or more associated laser diode arrays. Remote power is generally controlled by one or more switch mode power supplies operated as buck/boost power supplies. Because these power supplies can be located proximate to the laser diode arrays, high frequency switching of laser diode drive currents is possible. For example, pulse repetition rates of up to 1 kHz, 10 kHz, 50 kHz, 100 kHz, 200 kHz, 500 kHz, 1 MHz, or 2 MHz can be achieved, and laser pulse rise and fall times can be less than about 2 µs, 1 µs, 500 ns, or other value. Power supply efficiencies of at least 90%, 95%, 97.5% or more can be achieved. Total inductance between the laser diode drivers and the associated laser diode arrays can be less than about 10 nH, 5 nH, 1 nH, 500 pH, or 100 pH. In contrast, AC/DC power supplied at 602 is generally provided via cables that are associated with inductances of greater than 100 nH, and typically in a range of about 200 nH to 800 nH.

Figure 7:
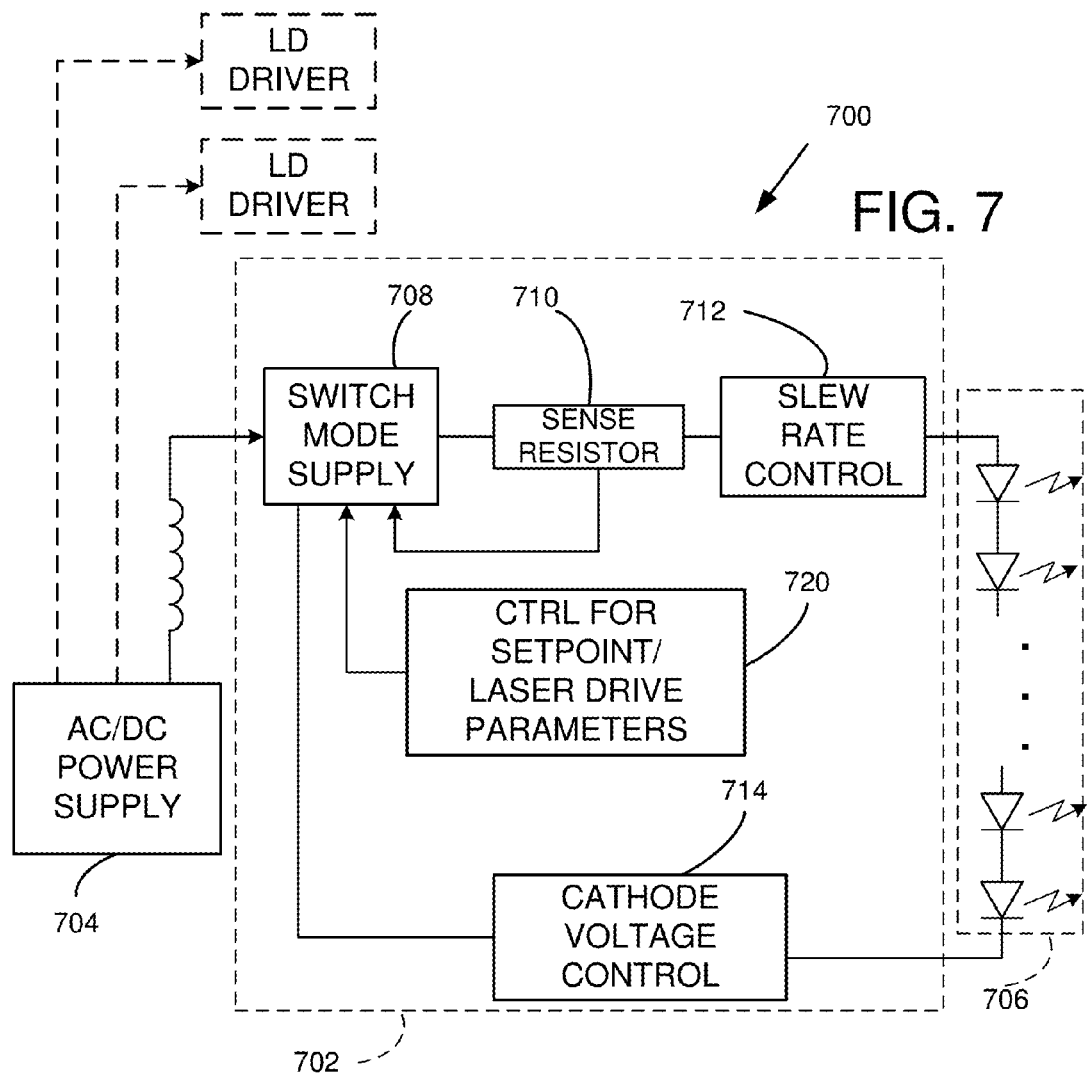
FIG. 7 illustrates a representative laser diode driver.

Referring to FIG. 7, a laser diode system 700 includes a laser diode driver 702 that is coupled to receive power from a power supply 704 and to provide a drive current to a linear laser diode array 706. The laser diode driver 702 includes a switching power supply 708 coupled to provide a laser drive current through a sense resistor 710 and a slew rate control circuit 712 that generally includes one or more capacitors. A cathode voltage control circuit 714 is in series with the laser diode array 706, and establishes a suitable laser diode array voltage. Typically, any excess voltage appears at the cathode voltage control circuit, and excess drive voltage appears across the cathode voltage control. A control circuit or digital controller 720 is coupled to the switching power supply 708 to establish pulse duration, width, and/or power. The power supply can be coupled to additional laser diode drivers as indicated schematically in FIG. 7.

Figure 8:
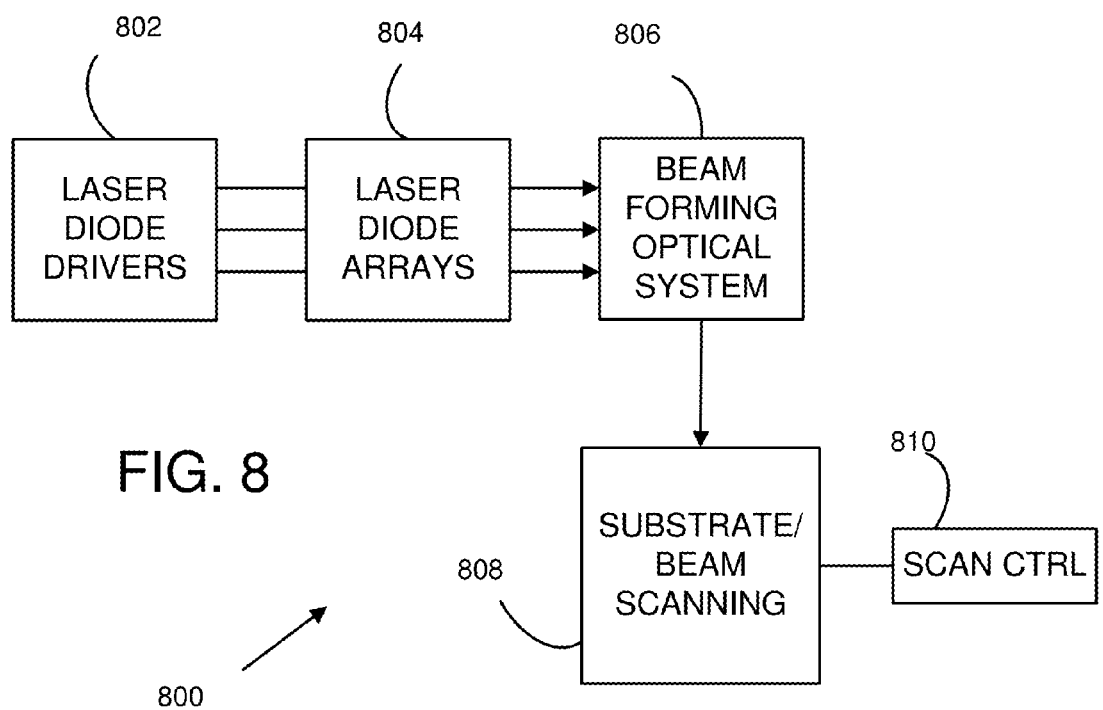
FIG. 8 illustrates a material processing system that uses an optical beam produced by one or more laser diode arrays.

FIG. 8 illustrates a representative materials processing system 800 that includes a plurality of laser diode drivers 802 such as disclosed above that are coupled to one or more laser diode arrays 804. Optical beams from the laser diodes of the laser diode arrays 804 are directed to a beam forming optical system 806 that combines, shapes, focuses, or otherwise processes the optical beams and delivers at least one optical beam (such as a combined optical beam) to a substrate. A substrate or beam scanning system 808 provides relative motion between the optical beam and the substrate. In some cases, a substrate stage is provided while in others, a beam scanner varies a propagation direction of the optical beam. In some cases, both beam scanning and substrate scanning are provided.

Figure 9:
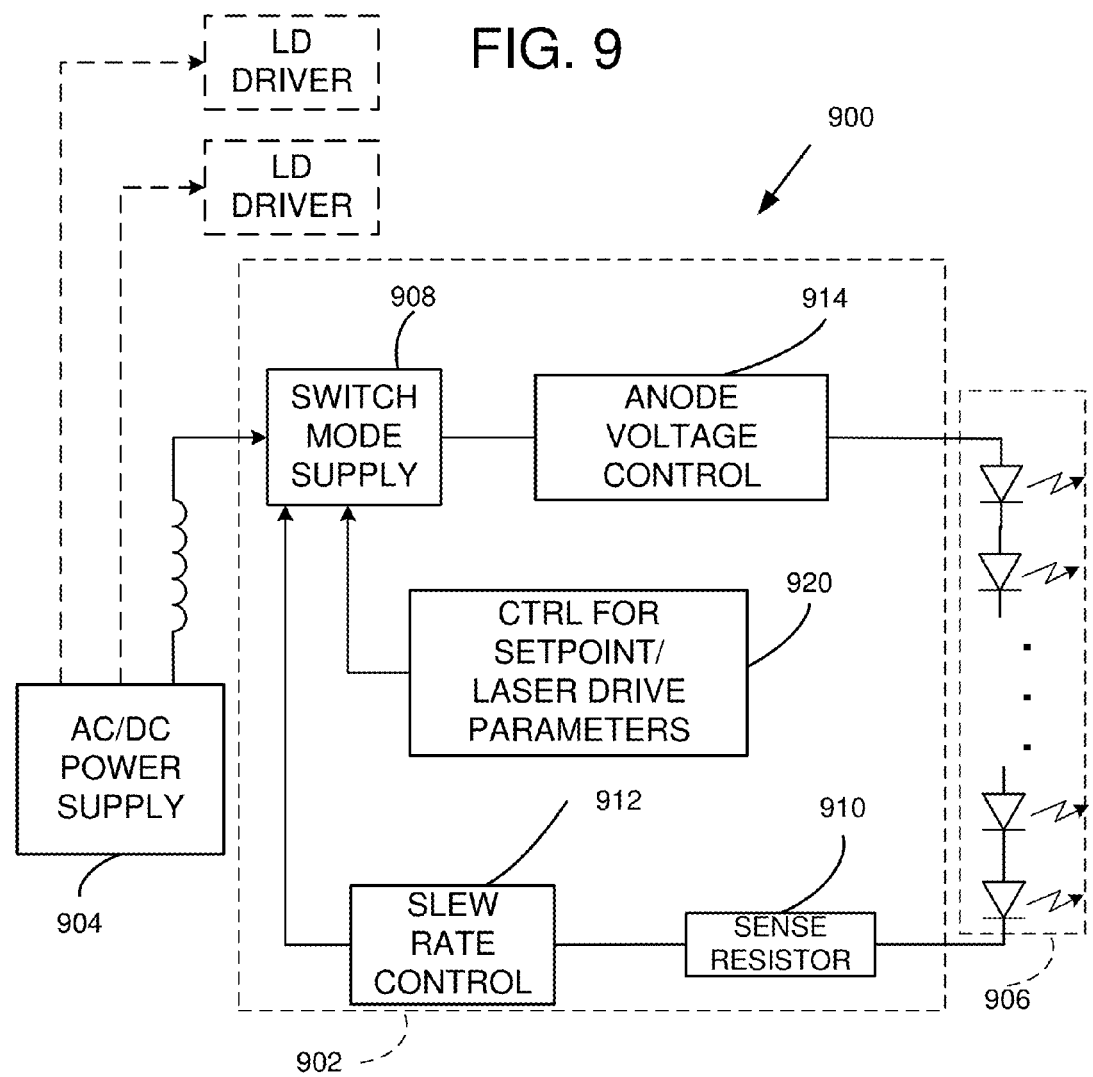
FIG. 9 illustrates a representative laser diode driver.
Figure 10:
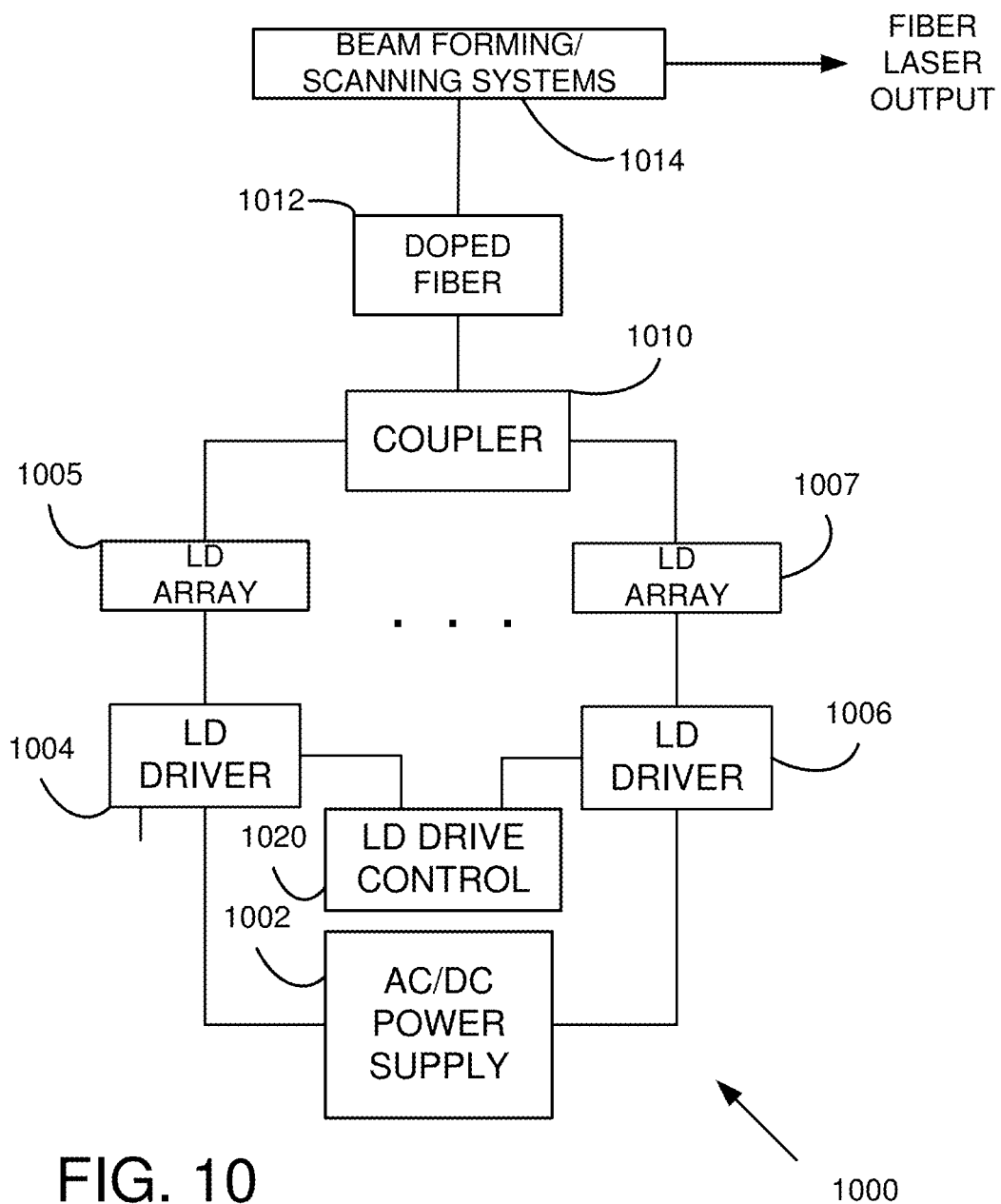
FIG. 10 illustrates a material processing system that uses an optical beam produced by one or more laser diode arrays to pump a doped optical fiber.

Referring to FIG. 9, a laser diode system 900 includes a laser diode driver 902 that is coupled to receive power from a power supply 904 and to provide a drive current to a laser diode array 906. The laser diode driver 902 includes a switching power supply 908 coupled to provide a laser drive current through an anode voltage control circuit 914. A sense resistor 910 and a slew rate control circuit 912 that generally includes one or more capacitors are coupled to a diode array cathode. A control circuit or digital controller 920 is coupled to the switching power supply 908 to establish laser diode drive pulse duration, width, and/or power. The power supply can be coupled to additional laser diode drivers as indicated schematically in FIG. 9.

A representative fiber laser system 1000 includes a power supply 1002 that is coupled to remote laser diode drivers 1004, 1006 that are in turn coupled to respective laser diode arrays 1005, 1007. Output power from the laser diode arrays 1005, 1007 is coupled via an optical coupler 1010 to a doped optical fiber 1012 so as to produce optical gain. The amplified output from the doped optical fiber 1012 is directed to a beam forming and/or beam scanning system 1014 to produce an output beam that is directed to a target to be processed. A controller 1020 is coupled to the laser diode drivers 1004, 1006 to select drive amplitude, pulse duration, pulse shape, pulse frequency or other drive characteristics. The doped optical fiber 1012 can serve as an amplifier, or be provided with one or more feedback elements so as to serve as a gain element in a laser.

Figure 11A:
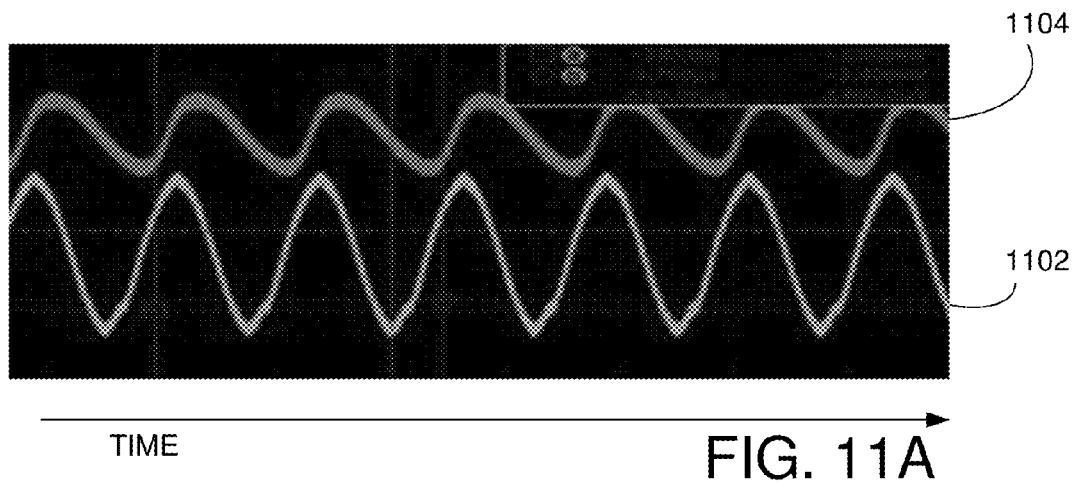
FIGS. 11A-11C illustrate diode array drive currents and fiber laser outputs as a function of time.

Referring to FIG. 11A, using conventional laser diode drivers, a plot of drive current 1102 and laser diode optical output 1104 as a function of time shows that the drive current 1102 never fully reaches an intended maximum or minimum value (square wave modulation). The optical output 1104 follows the drive current 1102 and is never fully on or fully off. In addition, the optical output 1004 exhibits relatively gradually turn on and turn off times.

Figure 11B:
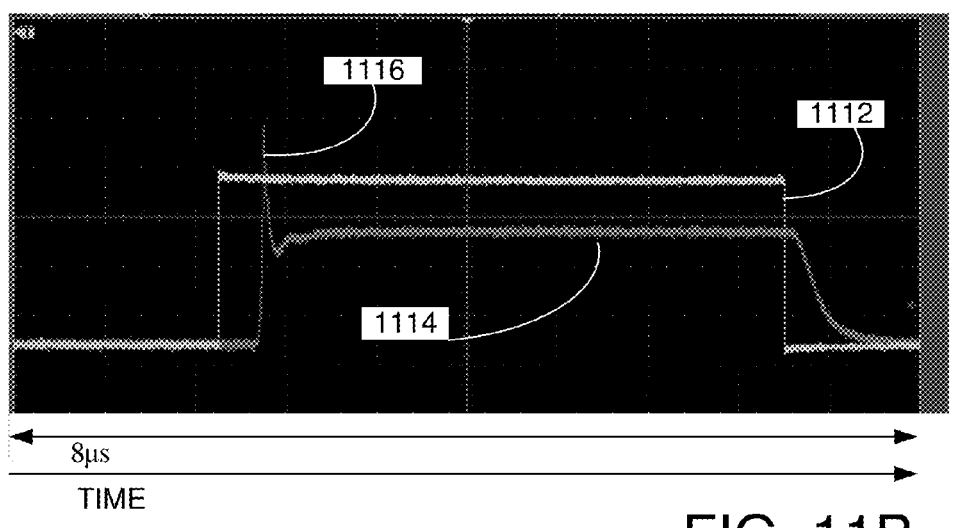

Referring to FIG. 11B, in a high speed system such as disclosed herein, a drive current 1112 has a more square waveform and an optical light output 1114 includes "gain switched spikes" or other high power spikes such as representative spike 1116 due to physics in a fiber laser cavity. These spikes can be very large, even up to 250% of "nominal" light output. This can provide significant advantages in materials processing using fiber lasers.

Figure 11C:
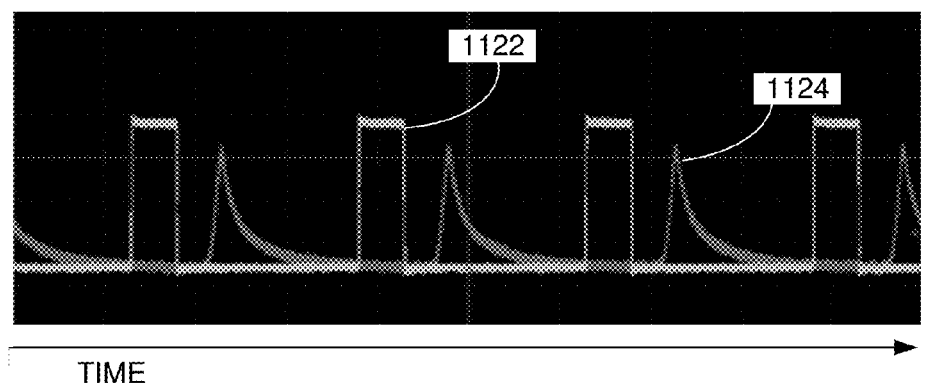

FIG. 11C illustrates drive current 1122 and laser output 1124 with 100 kHz pump laser diode modulation. The laser output shows optical pulses having relatively rapid initial turn-on times, followed by slower decay to a lower or zero output level.

In view of the many possible embodiments to which the principles of the disclosed technology may be applied, it should be recognized that the illustrated embodiments are only preferred examples and should not be taken as limiting the scope of the disclosure. I claim as my invention all that comes within the scope and spirit of the appended claims.

We claim:

1. A fiber laser processing system, comprising:
   a remote power supply;
   a plurality of laser diode drivers coupled to the remote power supply, each of the laser diode drivers including a switching power supply;
   at least one laser diode array coupled to each of the laser diode drivers so as to receive a drive current from the respective switching power supply; and
   a controller coupled to each of the laser diode drivers so as to select at least one of a drive current magnitude, a drive current duration, and a drive current frequency to be provided by the respective switching power supply, wherein at least one of the drive current magnitudes, the drive current durations, and the drive current frequencies is independently selectable, wherein each of the plurality of laser diode drivers further comprises:
   a sense resistor coupled to the switching power supply and to a first laser diode driver output; and
   a voltage controller coupled to a second laser diode driver output, wherein the first and second laser diode driver outputs are coupled to provide a laser diode drive current such that the sense resistor is in series with the laser diode drive current.

2. The fiber laser processing system of claim 1, wherein the first and second laser diode outputs of each of the switching power supplies corresponds to a laser diode array cathode and a laser diode array anode, respectively.

3. The fiber laser processing system of claim 1, wherein each of the switching power supplies includes a setpoint input associated with a voltage range to be input to the switching power supply.

4. The fiber laser processing system of claim 1, wherein each of the laser diode drivers further comprises a voltage control circuit situated to in series with the laser diode drive current so as to establish a laser diode array cathode voltage based on a selected laser diode array drive current.

5. The fiber laser processing system of claim 3, wherein each of the switching power supplies is coupled to a laser diode drive control that establishes at least one of a laser diode pulse rate, pulse duration, and pulse power.

6. The fiber laser processing system of claim 4, wherein the laser diode drive control establishes a laser diode pulse rate, wherein the pulse rate is at least 100 kHz.

7. The fiber laser processing system of claim 3, wherein each of the laser diode drivers further comprises a slew rate control coupled to at least one of the first and second laser diode driver outputs so as to limit a laser diode drive current slew rate.

8. The fiber laser processing system of claim 7, wherein the slew rate control includes at least one capacitor that establishes a maximum laser diode drive current slew rate.

9. A fiber laser processing system, comprising:
   a remote power supply;
   a plurality of laser diode drivers coupled to the remote power supply, each of the laser diode drivers including a switching power supply, wherein the remote power supply is coupled to provide power to the switching power supply of each of the laser diode drivers;

at least one laser diode array coupled to each of the laser diode drivers so as to receive a drive current from the respective switching power supply; and a controller coupled to each of the laser diode drivers so as to select at least one of a drive current magnitude, a drive current duration, and a drive current frequency to be provided by the respective switching power supply, wherein at least one of the drive current magnitudes, the drive current durations, and the drive current frequencies is independently selectable.

10. The fiber laser processing system of claim 9, further comprising a doped optical fiber that receives laser outputs from the laser diode arrays and produces a processing beam.

11. The fiber laser processing system of claim 10, further comprising a scanning system that moves a substrate and the processing beam with respect to each other.

12. The fiber laser processing system of claim 9, wherein the drive current frequencies for each of the laser diode drivers are a common frequency that is at least 50 kHz.

13. The fiber laser processing system of claim 9, wherein at least one of the plurality of laser diode drivers is coupled to a plurality of laser diode arrays so as to establish a common drive current in each laser of the plurality of laser diode arrays.

14. The fiber laser processing system of claim 10, wherein the doped fiber is included in a fiber laser.

15. The fiber laser processing system of claim 14, wherein the controller selects at least one of the drive current magnitude, the drive current duration, and the drive current frequency to such that an optical output from the doped optical fiber includes a plurality of power spikes having pulse rise times of less than about 1 μs, 100 ns, 10 ns, 1 ns, or 0.5 ns.

16. The fiber laser processing system of claim 9, wherein the switching power supplies of each of the plurality of laser diode drivers are buck/boost switch mode power supplies.

* * * * *